(12) United States Patent
Fujiwara et al.

(10) Patent No.: US 6,703,876 B2
(45) Date of Patent: Mar. 9, 2004

(54) REFERENCE CLOCK GENERATION SYSTEM AND DEVICE

(75) Inventors: Masayu Fujiwara, Kyoto (JP); Yasunori Kawamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/078,232

(22) Filed: Feb. 15, 2002

(65) Prior Publication Data

US 2002/0118069 A1 Aug. 29, 2002

(30) Foreign Application Priority Data

Feb. 23, 2001 (JP) ........................................ 2001-048023

(51) Int. Cl.$^7$ ................................................ H03L 7/06
(52) U.S. Cl. ........................ 327/156; 327/291; 375/376; 331/DIG. 2
(58) Field of Search ................................. 327/291, 299, 327/144, 146–148, 155–157, 162, 165; 375/373–376, 362; 331/1 A, 2, 177 R, DIG. 2; 365/233, 233.5

(56) References Cited

U.S. PATENT DOCUMENTS

| | | | | |
|---|---|---|---|---|
| 5,339,050 A | * | 8/1994 | Llewellyn | 331/16 |
| 5,579,184 A | * | 11/1996 | Nakanishi et al. | 360/51 |
| 6,188,258 B1 | * | 2/2001 | Nakatani | 327/157 |
| 6,218,876 B1 | * | 4/2001 | Sung et al. | 327/156 |

* cited by examiner

Primary Examiner—Minh Nguyen
(74) Attorney, Agent, or Firm—Hogan & Hartson

(57) ABSTRACT

A clock generation system having a multiplicity of PLL circuit stages connected in series such that frequency division ratios are distributed over the respective PLL circuit stages to attain the predetermined ratio, with the first PLL circuit stage receiving the first clock and the last PLL circuit stage outputting the second clock. The frequency division ratios distributed such that, at least in the PLL circuit stages other than the first stage, the S/N ratios of the respective PLL circuit stages are smaller than the S/N ratio of the noise floor associated with the clock generation system.

6 Claims, 3 Drawing Sheets

REFERENCE CLOCK GENERATION SYSTEM AND DEVICE

FIELD OF THE INVENTION

The invention relates to a clock generation system for generating, from a first clock having a given clock frequency, a second clock having a second frequency of predetermined frequency ratio relative to the first clock frequency.

BACKGROUND OF THE INVENTION

It has been conventional in the art of digital TV, DVHS, DVD, and game machines to generate from a first clock having a given frequency a second reference clock having a second frequency.

For example, in a HIGH VISION TV signal system, a desired reference clock of 74.25 MHz is obtained from an externally input 54 MHz (13.5 MHz×4) clock by stepping up (or stepping down in certain cases) the given clock frequency with a desired ratio (e.g. 54 MHz×11/8=74.25 MHz). The external clock of 54 MHz is generated from a characteristic frequency (13.5 MHz) of quartz oscillator (13.5 MHz×4).

In the HIGH VISION TV signal system, synchronization signals are provided for conversion of the HIGH VISION signal (60 Hz) to NTSC-TV signal (59.94 Hz) and vise versa. The frequencies of these synchronization signals have a ratio of 1001:1000. These synchronization signals can be obtained by a phase locked loop (PLL) circuit.

FIG. 1 shows a typical reference clock generation circuit using a conventional PLL circuit. As seen in FIG. 1, the PLL circuit is provided with a first reference clock F1 of 54 MHz and converts the signal into a second reference clock by frequency converting 54 MHz to 54/1.001 MHz.

To do this a first frequency divider 1 divides the frequency 54 MHz of the input signal to 1/1001 and uses it as a comparison signal P1 input to one terminal of a phase comparator 3, as shown in FIG. 1. A second frequency divider 2 further divides the frequency of the output of the PLL circuit to 1/1000 to generate another comparison signal P2 for the phase comparator 3. The phase comparator 3 compares the two input P1 and P2 to generate a comparison output associated with the difference in phase between them. The comparison output is smoothed by a low-pass filter (LPF) 4 to generate a control signal for controlling a voltage controlled oscillator (VCO) 5. The VCO 5 is controlled by the input control signal such that the two signals input to the phase comparator 3 match in frequency and in phase. Since the loop gain of the PLL circuit is large, residual system deviation thereof is negligibly small, so that the second reference clock F2 generates an output having 54×1000/1001 MHz in accordance with the division ratio between the first and the second frequency dividers 1 and 2, respectively.

The signal-to-noise (S/N) ratio of the PLL circuit of FIG. 1 can be obtained based on a well known noise theory, as follow. The S/N ratio is improved by a factor of 20log1001 [dB] in the first frequency division of the first reference clock F1 by 1001. Thus, the S/N ratio of the output of the first frequency divider 1 is theoretically given by the S/N ratio of the first reference clock F1 plus 20log1001 [dB]. Hence, assuming that the first reference clock F1 has an S/N ratio of 80 [dB], the S/N ratio of the output of the first frequency divider 1 is about (80+60)=140 [dB].

However, since the PLL circuit is formed on an integrated circuit (IC), the PLL circuit operates on the noise floor of the IC and hence the S/N ratio of the PLL circuit cannot be better than the S/N ratio of the noise floor. The S/N ratio of the noise floor is determined mainly by the fluctuations of the source voltage, which is normally about 90 [dB]. In other words, the S/N ratio of the PLL circuit is limited by the S/N ratio of the noise floor. Consequently, the maximum possible S/N ratio of the output of the first frequency divider 1, i.e. the comparison input signal P1 of the phase comparator 3, is at best 90 [dB].

The S/N ratio of the other comparison input P2 of the phase comparator 3 is also 90 [dB], since the S/N ratio of the two comparison inputs P1 and P2 of the phase comparator 3 are the same.

The input to the second frequency divider 2, i.e. the second reference clock F2, is stepped up in frequency by a factor of 1000, so that the S/N ratio of the input is stepped down by 20log1000 [dB]. Consequently, the second reference clock F2 has S/N ratio equal to the S/N ratio of the comparison input P2 minus 20log1000 [dB] or 30 [dB].

In this way, although conventional PLL circuits can generate a second reference clock F2 having a desired frequency equal to the frequency of the first reference clock F1 multiplied by a predetermined ratio (e.g. 1000/1001), the S/N ratio of the second reference clock F2 is disadvantageously reduced to as low as 30 [dB]. Such low S/N ratio is a serious problem in video clock technology, since video clocks are generally required to have S/N ratio of at least 50 [dB].

SUMMARY OF THE INVENTION

It is therefore an object of the invention to provide a clock generation system, and a clock generation device as well, comprising PLL circuits adapted to generate from a first clock having a first clock frequency a second reference clock having a second clock frequency which is related to the first clock frequency by a predetermined ratio, such that the second clock has a sufficiently high S/N ratio irrespective of the limitation by the noise floor of the system.

To accomplish the object, the invention provide a clock generation system for generating from a given first clock having a first clock frequency a second clock having a second clock frequency which is related to the first clock frequency by a predetermined ratio, the clock generation system comprising:

a multiplicity of PLL circuit stages connected in series such that frequency division ratios are distributed over said respective PLL circuit stages to attain said predetermined ratio, with the first PLL circuit stage receiving said first clock and the last PLL circuit stage outputting said second clock, each of said PLL circuit stages having
  a first frequency divider for frequency dividing the clock signal input thereto;
  a second frequency divider for frequency dividing the output of said PLL circuit stage;
  a phase comparator for comparing said frequency divided output of said first frequency divider and the frequency divided output of said second frequency divider;
  a filter for filtering the output of said comparator; and
  a voltage controlled oscillator controlled by the output of said filter for supplying said second frequency divider with a signal having a controlled frequency, wherein
    said first and second frequency dividers are adapted to perform frequency division assigned to said PLL circuit stage.

In view of the fact that the S/N ratio of a PLL circuit increases with the frequency division ratio, hence decreases with the step-up ratio, and that the maximum S/N ratio is limited by the noise floor associated with the PLL circuit, the multiplicity of series PLL circuit stages are provided in such a way that the stages have distributed frequency division ratios to altogether attain a desired S/N ratio even under the noise floor. Such distribution of frequency division ratios ensures circumvention of the limitation of the maximum S/N ratio by the noise floor, thereby allowing the conversion of the first clock into the second clock having a sufficiently large S/N ratio.

In the inventive multi-staged PLL circuit, the frequency division ratios of the first and the second frequency dividers are set, at least in the stages other than the first, such that their S/N ratios are smaller than that of the noise floor.

Hence, except for the first stage where the S/N ratio depends largely on the S/N ratio of first clock input thereto, noise floor limitation can be circumvented in the subsequent stages. Given the S/N ratio of the first clock, it is possible to configure all the PLL circuit stages to circumvent the noise floor limitation.

In the example shown herein the first clock is the reference clock of HIGH VISION TV signal system and the second clock is the reference clock of NTSC TV signal system. The predetermined ratio is 1000/1001 for the former signal system and 4×1000/1001 for the latter signal system.

In this arrangement, 54 MHz and 13.5 MHz reference clock for HIGH VISION TV signal system and 54/1.001 MHz reference clock for NTSC TV signal system having a desired S/N ratio can be obtained without being limited by the relevant noise floor.

DETAILED DESCRIPTION OF THE PREFERRED EMBODIMENT

The invention will now be described in detail by way of example with reference to the accompanying drawings.

Figure 2:
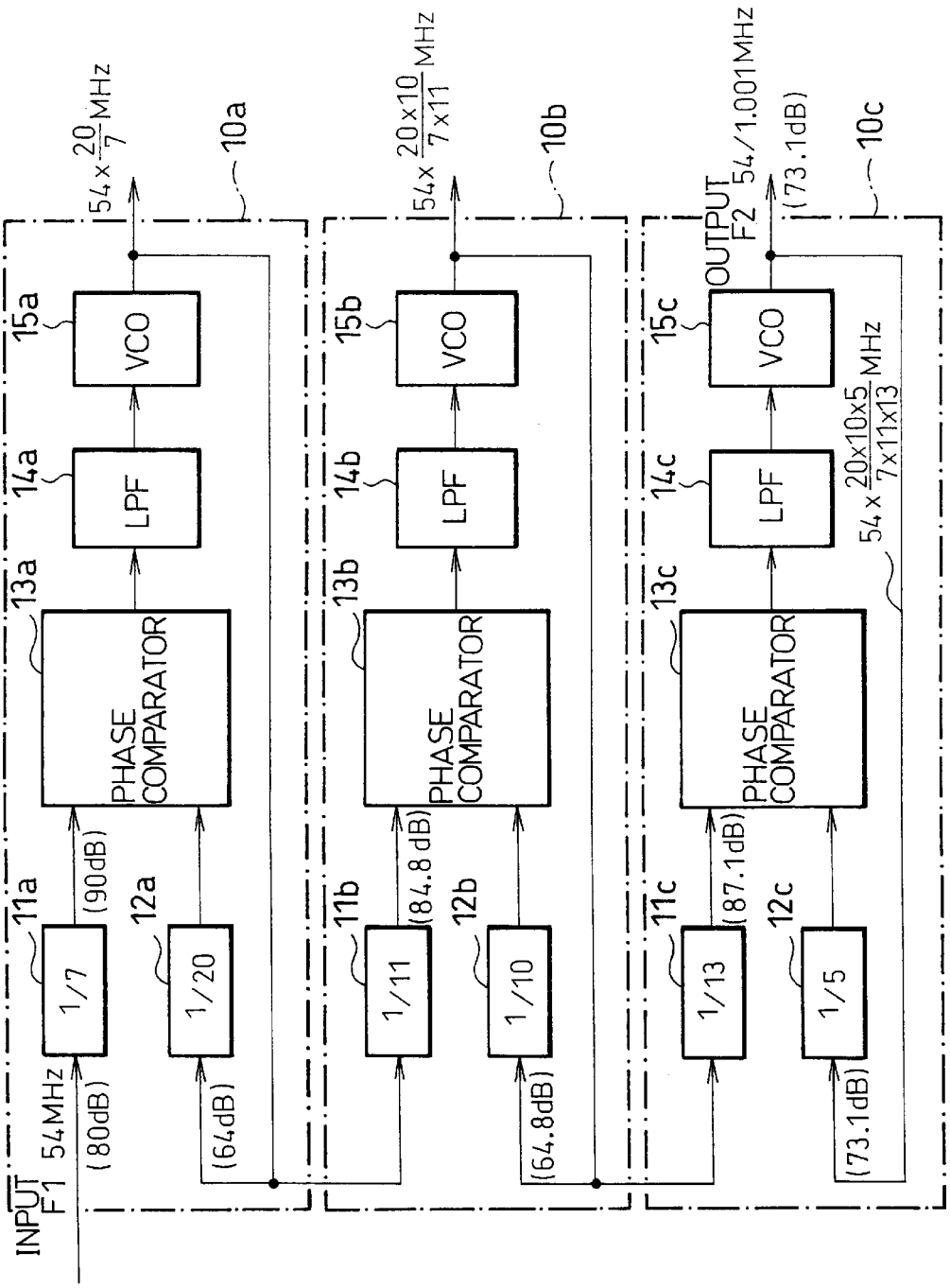
FIG. 2 is a block diagram representation of a first embodiment of a clock generation system according to the invention.

Referring now to FIG. 2, there is shown a first clock generation system built in an IC chip according to the invention.

The S/N ratio of a PLL circuit built in an IC increases with the frequency division ratio, and hence decreases with step-up ratio On the other hand, the maximum S/N ratio is limited by the S/N ratio of the noise floor of the IC. Hence, by splitting and distributing a desired frequency division ratio among a multiplicity of PLL circuits connected in series, the limitation of the S/N ratio by the noise floor can be circumvented or minimized.

In the example shown herein, a first through a third PLL circuit $10a$, $10b$, and $10c$, respectively, are connected in series such that if the first reference clock F1 of reference frequency 54 MHz is input to the first PLL circuit $10a$, a second reference clock F2 of 54/1.001 MHz is output from the third PLL circuit $10c$.

It is assumed here that the clock generation system has the same noise floor as conventional one, which is 90 [dB].

In the clock generation system shown in FIG. 2, the first PLL circuit $10a$ includes a first frequency divider $11a$ having a frequency division ratio of 1/7, a second frequency divider $12a$ having a frequency division ratio of 1/20, a phase comparator $13a$, a low-pass filter $14a$, and a voltage controlled oscillator $15a$. The first PLL circuit stage has basically the same structure as the conventional one, except that the respective frequency dividers have different frequency division ratios as compared with conventional ones. The second PLL circuit $10b$ includes like elements as the first PLL circuit $10a$, with the like elements referenced by like reference numerals tagged with character "b" instead of "a". The second PLL circuit $12b$ only differs from the first in that the first frequency divider $11b$ has a frequency division ratio of 1/11 and the second frequency divider $12b$ has a frequency division ratio of 1/10. Similarly, the third PLL circuit $10c$ includes like elements as the first PLL circuit $10a$, referenced by like reference numerals tagged with character "c" instead of "a". A first frequency divider $11c$ has a frequency division ratio of 1/13, and a second frequency divider $12c$ has a frequency division ratio of 1/5.

As a result of series connection of the PLL circuits $10a$–$10c$, the resultant division ratio becomes (20/7)×(10/11)×(5/13), which equals 1000/1001. This division ratio converts the first reference frequency 54 MHz of the first reference clock F1 to 54/1.001 MHz, which is the second reference frequency of the second clock F2.

If the S/N ratio of the first reference clock F1 input to the first PLL circuit $10a$ is 80 [dB], as in conventional PLL circuits, the S/N ratio of the phase comparator $13a$ turns out to be (80+20log7) [dB] or 96.7 [dB]. However, since this is larger than the S/N ratio 90 [dB] of the noise floor, the final S/N ratio will be limited to 90 [dB]. Because of this limitation by the noise floor, S/N ratio will be lost by 6.7 [dB]. The output S/N ratio of the first PLL circuit $10a$ will be (90–20log20) [dB], which equals 64 [dB]. The frequency of the output is 54×20/7 MHz.

In the second PLL circuit $10b$, since the S/N ratio of the clock received from the first PLL circuit $10a$ is 64 MHz, the S/N ratio of the phase comparator $13b$ is (64+20log11) [dB] or 84.8 [dB]. Since this S/N ratio is smaller than that of the noise floor (90 [dB]), it is not be affected by the noise floor, and remains to be 84.8 [dB]. The output S/N ratio of the second PLL circuit $10b$ is then (84.8–20log10) [dB] or 64.8 [dB]. The frequency of the output clock is 54×20×10/(7×11) MHz.

In the third PLL circuit $10c$, since the S/N ratio of the clock received from the second PLL circuit $10b$ is 64.8 [dB], the S/N ratio of the phase comparator $13c$ is (64.8+20log13) [dB] or 87.1 [dB]. This S/N ratio is also smaller than that of the noise floor (90 [dB]), so that the S/N ratio is not limited by the noise floor and remains to be 87.1 [dB]. The output S/N ratio of the third PLL circuit $10c$ is (87.1–20log5) [dB] or 73.1 [dB]. The frequency of the output is 54×20×10>5/(7×11×13)=54/1.001 MHz, which is the desired frequency of the second reference clock.

In this way, the frequency division ratio 1000/1001 is split to 20/7, 10/11, and 5/13 and distributed over the series PLL circuits $10a$–$10c$ in this proportion. Although the S/N ratio is slightly lost (6.7 [dB]) in the first PLL circuit $10a$ by the noise floor, the S/N ratios are not affected by the noise floor in the subsequent second and third PLL circuits $10b$ and $10c$, respectively. That is, except for the first of the series PLL circuit stages, the S/N ratios in the subsequent stages are set not to exceed that of the noise floor.

Figure 1:
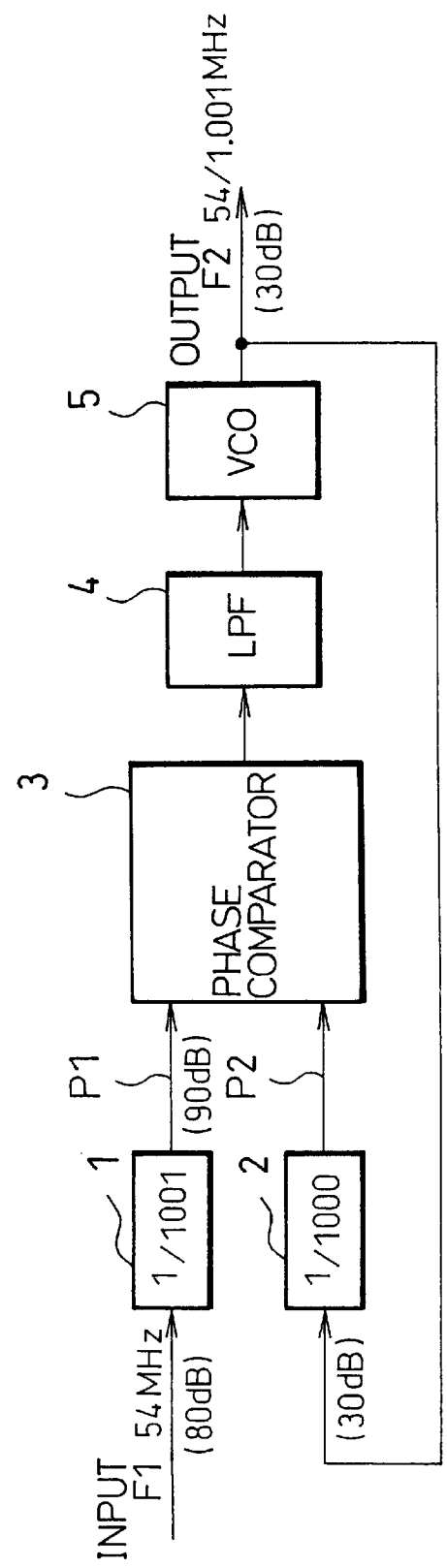
FIG. 1 is a block diagram representation of a conventional clock generation system.

Accordingly, the second reference clock signal F2 has a sufficiently high S/N ratio of 73.1 [dB] which can be used as the video clock. As compared with the conventional clock shown in FIG. 1, the S/N ratio of the second reference clock F2 is thus improved by (73.1−30) [dB] or 43.1 [dB].

Incidentally, although the first PLL circuit 10a of the embodiment shown in FIG. 2 is affected by the noise floor, this can be circumvented by increasing the number of the stages to reduce the frequency division ratio assigned to the first frequency divider 11a of the first PLL circuit 10a below that of the noise floor. In this case, none of the stages has a higher S/N ratio than the noise floor.

Instead of such multistage PLL circuits, only two series PLL circuits may be used. Although the S/N ratio of such two-stage system is a little lower than the foregoing multistage system, the S/N ratio is still better than those of conventional systems.

Figure 3:
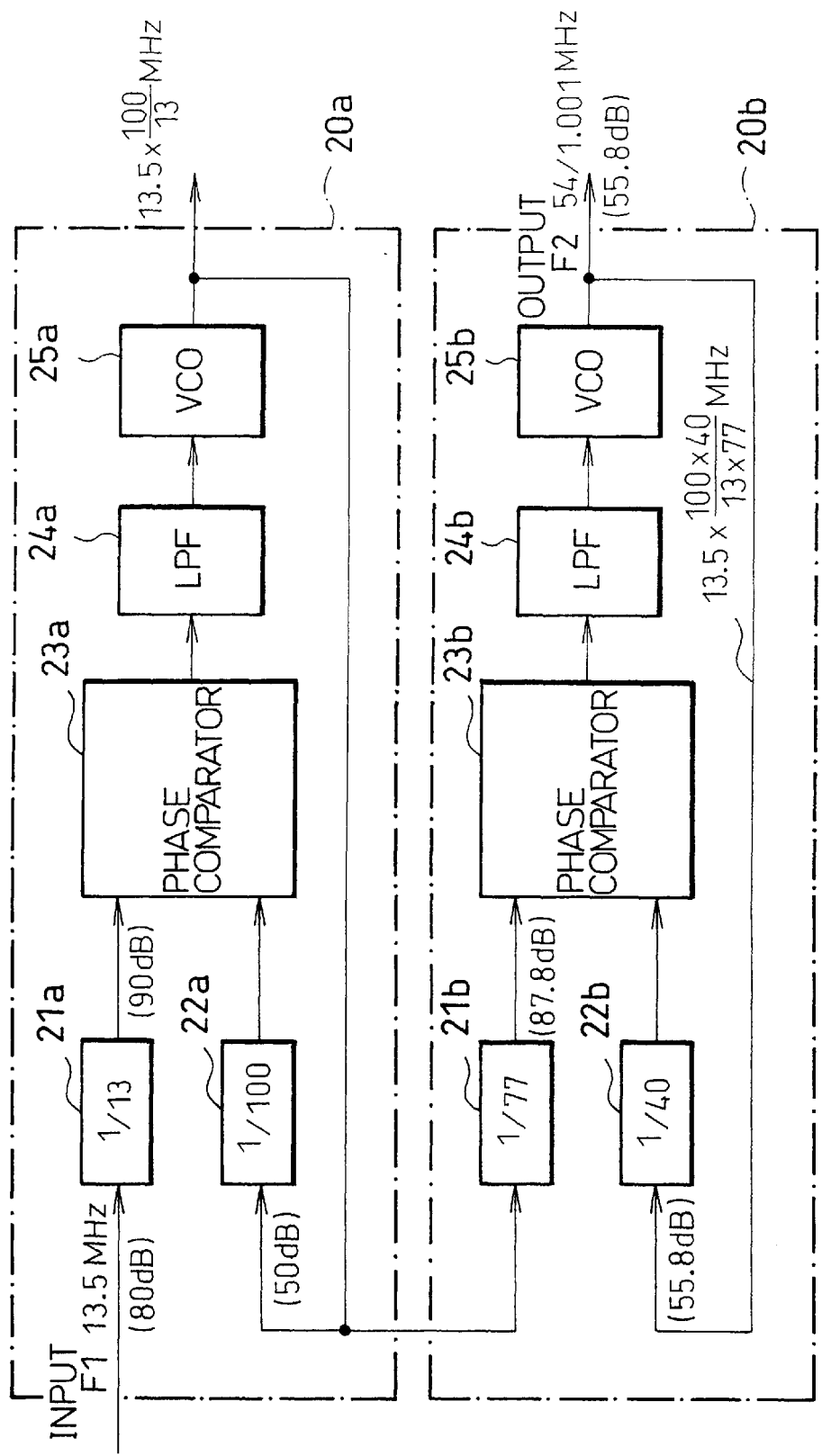
FIG. 3 is a block diagram representation of a second embodiment of a clock generation system according to the invention.

FIG. 3 shows a second embodiment of an inventive clock generation system built in an IC chip, in which a conventional 13.5 MHz clock generated by a quartz oscillator is input as the first reference clock to obtain for example a video synchronization signal having frequency of 54×1000/1001 MHz.

Prior to describing the second embodiment of the invention in detail, prior art for getting a reference clock of 54 MHz and a second clock of 54×1000/1001 MHz from the first reference clock of 13.5 MHz will be discussed below for comparison. The S/N ratio of the first reference clock is assumed to be 80 [dB], and the S/N ratio of the noise floor to be 90 [dB].

In a conventional PLL circuit, a second reference clock F2 of 54 MHz is obtained by frequency dividing the input clock by frequency division ratio 1/10 in the first frequency divider, and further frequency divided by frequency division ratio 1/40 in the second frequency divider. The S/N ratio of the clock output from the first frequency divider is (80+20log10) [dB] or 100 [dB], which is limited by the noise floor to 90 [dB], so that the S/N ratio of the second clock is (90−20log40) [dB] or 58.1 [dB]. On the other hand, a second reference clock F2 of 54×1000/1001 MHz is obtained by setting the first and the second frequency division ratios of the respective frequency dividers to 1/1001 and 1/4000. Then the output S/N ratio provided by the first frequency divider is (80+20log1001) [dB] or 140 [dB], which is limited to 90 [dB] by the noise floor. The resultant S/N ratio of the second clock is (90−20log4000) [dB] or 18.2 [dB].

It is therefore possible to obtain a good S/N ratio for the 54 MHz video clock in the confessional approach. However, for the S/N ratio of the 54×1000/1001 MHz second reference clock, the S/N ratio is reduced to 18.2 [dB] for the reason discussed above.

Referring to FIG. 3, a second embodiment of the invention will now be described in detail. This embodiment has a first PLL circuit 20a receiving a first reference clock F1 of 13.5 MHz and a second PLL circuit 20b connected in series with the first PLL circuit 20a for outputting a second reference clock F2 of 54/1.001 MHz. The second reference clock F2 is obtained through frequency divisions of the first reference clock F1.

To do this, the first PLL circuit 20a includes a first frequency divider 21a having a frequency division ratio 1/13, a second frequency divider 22a having a frequency division ratio 1/100, a phase comparator 23a, a low-pass filter 24a, and a voltage controlled oscillator 25a. The second PLL circuit 20b includes like elements as the first frequency divider 20a referenced by like reference numerals with character "b" attached to the respective reference numbers instead of "a". However, the second frequency divider differs from the first in that the first frequency divider 21b has a frequency division ratio 1/77 and the second frequency divider 22b has a frequency division ratio 1/40.

Because of the cascade connection of the first and the second PLL circuits 20a and 20b, the overall frequency division ratio is (100/13)×(40/77) or 4000/1001. Consequently, 54/1.001 MHz second reference clock F2 results from the first reference clock F1 of 13.5 MHz through the frequency divisions.

Assuming that the S/N ratio of the first reference clock F1 input to the first PLL circuit 20a is 80 [dB] as in conventional PLL circuit, the S/N ratio of the phase comparator 23a turns out to be (80+20log13) [dB] or 102.3 [dB]. Since this S/N ratio is greater than that of the noise floor, the S/N ratio is limited by the noise floor to 90 [dB], thereby losing S/N ratio by 12.3 [dB]. The S/N ratio of the clock output from the first PLL circuit 20a is (90−20log100) [dB] or 50 [dB]. The frequency of the output clock is 13.5×100/13 MHz.

Since the S/N ratio of the output of the first PLL circuit 20a is 50 [dB], the S/N ratio of the phase comparator 23b of the second PLL circuit 20b is (50+20log77) [dB] or 87.8 [dB]. Being smaller than the S/N ratio 90 [dB] of the noise floor, this S/N ratio will not be limited by the noise floor and will remain 87.8 [dB]. Then the S/N ratio of the second reference clock output from the second PLL circuit 20b will be (87.8−20log40)=55.8 [dB]. The frequency of the output clock is 13.5×100×40/(13×77)=54/1.001 MHz, as desired.

In this way, in the second embodiment, the frequency division ratio of 4000/1001 is split and distributed over the first and the second series PLL circuits 20a and 20b, respectively, in proportion of 100/13 and 40/77 so that the S/N ratio of the second PLL circuit 20b will not be limited by the noise floor, admitting a minor loss of S/N ratio (12.3 [dB]) only in the first PLL circuit 20a.

Accordingly, the second reference clock F2 can be a satisfactory video clock having S/N ratio of 55.8 [dB]. It would be appreciated that the second reference clock F2 has a better S/N ratio than the above mentioned conventional clock by (55.8−18.2)=37.6 [dB].

Although the first PLL circuit 20a of the second embodiment is limited in S/N ratio by the noise floor, it provides a yet better S/N ratio than the first embodiment, which is desirable for the dimensional minimization of a clock circuit. An additional third PLL circuit stage may be added to further reduce the frequency division ratio of the first frequency divider 21a of the first PLL circuit below the critical noise level (90 [dB] in the example shown herein) of the noise floor. In that case, the S/N ratio of the second reference clock F2 can be raised to (80−20log4)=68 [dB], which is the theoretical upper limit that can be attained.

Although the invention has been described with particular reference to certain preferred embodiments thereof, variations and modifications of the present invention can be effected within the scope of the invention. For example, low-pass filters used to filter comparison outputs of the phase comparators, they can be any other type of filters.

What we claim is:

1. A clock generation system for generating, from a given first reference clock, having a first clock frequency, a second reference clock, having a second clock frequency which is related to said first reference clock frequency by a predetermined ratio, said clock generation system comprising:

three PLL circuit stages connected in series such that frequency division ratios are distributed over said respective PLL circuit stages to attain said predetermined ratio, with the first PLL circuit stage receiving said first reference clock and the last PLL circuit stage outputting said second reference clock, each of said three PLL circuit stages having
a first frequency divider for frequency dividing the input thereto by a fixed predetermined frequency division ratio;
a second frequency divider for frequency dividing the output of the respective PLL circuit stage by another fixed predetermined frequency division ratio;
a phase comparator for comparing the frequency divided output of said first frequency divider and the frequency divided output of said second frequency divider;
a filter for filtering the output of said comparator; and
a voltage controlled oscillator controlled by the output of said filter for supplying said second frequency divider with a signal having a controlled frequency, wherein
said first reference clock, has a 54 MHz High Vision signal system frequency, and said second reference clock, has a 54/1.001 MHz signal frequency which is related to said first reference clock frequency by a predetermined ratio 1000/1001, and wherein,
said fixed predetermined frequency division ratios of said first and second frequency dividers are adapted to perform frequency division assigned to the respective PLL circuit stage.

2. The clock generation system according to claim 1, wherein at least in one of the PLL circuit stages other than the first stage, said fixed predetermined frequency division ratios of said first and second frequency dividers of said three PLL circuit stages are set such that the S/N ratio of said PLL circuit stage is smaller than the S/N ratio of the noise floor associated with said clock generation system.

3. A clock generation device built in an integrated circuit (IC) chip for generating, from a given first reference clock, having a first clock frequency, a second reference clock, having a second clock frequency which is related to said first reference clock frequency by a predetermined ratio, said clock generation device comprising:
three PLL circuit stages connected in series such that frequency division ratios are distributed over said respective PLL circuit stages to attain said predetermined ratio, with the first PLL circuit stage receiving said first reference clock and the last PLL circuit stage outputting said second reference clock, each of said PLL circuit stages having
a first frequency divider for frequency dividing the input thereto by a fixed predetermined frequency division ratio;
a second frequency divider for frequency dividing the output of the respective PLL circuit stage by another fixed predetermined frequency division ratio;
a phase comparator for comparing the frequency divided output of said first frequency divider and the frequency divided output of said second frequency divider;
a filter for filtering the output of said comparator; and
a voltage controlled oscillator controlled by the output of said filter for supplying said second frequency divider with a signal having a controlled frequency, wherein
said first reference clock, has a 54 MHz High Vision signal system frequency, and said second reference clock, has a 54/1.001 MHz signal frequency which is related to said first reference clock frequency by a predetermined ratio 1000/1001, and wherein,
said fixed predetermined frequency division ratios of said first and second frequency dividers are adapted to perform frequency division assigned to the respective PLL circuit stage.

4. The clock generation device according to claim 3, wherein at least in one of the PLL circuit stages other than the first stage, said fixed predetermined frequency division ratios of said first and second frequency dividers of said three PLL circuit stages are set such that the S/N ratio of said PLL circuit stage is a smaller than the S/N ratio of the noise floor associated with said clock generation device.

5. A clock generation system for generating, from a given first reference clock, having a first clock frequency, a second reference clock, having a second clock frequency which is related to said first reference clock frequency by a predetermined ratio, said clock generation system comprising:
two PLL circuit stages connected in series such that frequency division ratios are distributed over said respective PLL circuit stages to attain said predetermined ratio, with the first PLL circuit stage receiving said first reference clock and the last PLL circuit stage outputting said second reference clock, each of said two PLL circuit stages having
a first frequency divider for frequency dividing the input thereto by a fixed predetermined frequency division ratio;
a second frequency divider for frequency dividing the output of the respective PLL circuit stage by another fixed predetermined frequency division ratio;
a phase comparator for comparing the frequency divided output of said first frequency divider and the frequency divided output of said second frequency divider;
a filter for filtering the output of said comparator; and
a voltage controlled oscillator controlled by the output of said filter for supplying said second frequency divider with a signal having a controlled frequency, wherein
said first reference clock, has a 13.5 MHz High Vision signal system frequency, and said second reference clock, has a 54/1.001 MHz signal frequency which is related to said first reference clock frequency by a predetermined ratio 4×1000/1001, wherein,
said fixed predetermined frequency division ratios of said first and second frequency dividers are adapted to perform frequency division assigned to the respective PLL circuit stage, and wherein,
in the last PLL circuit stage, said fixed predetermined frequency division ratios of said first and second frequency dividers of said two PLL circuit stages are set such that the S/N ratio of said PLL circuit stage is smaller than the S/N ratio of the noise floor associated with said clock generation system.

6. A clock generation device built in an integrated circuit (IC) chip for generating, from a given first reference clock, having a first clock frequency, a second reference clock, having a second clock frequency which is related to said first reference clock frequency by a predetermined ratio, said clock generation system comprising:
two PLL circuit stages connected in series such that frequency division ratios are distributed over said respective PLL circuit stages to attain said predetermined ratio, with the first PLL circuit stage receiving said first reference clock and the last PLL circuit stage outputting said second reference clock, each of said two PLL circuit stages having a first frequency divider for frequency dividing the input thereto by a fixed predetermined frequency division ratio;

a second frequency divider for frequency dividing the output of the respective PLL circuit stage by another fixed predetermined frequency division ratio;

a phase comparator for comparing the frequency divided output of said first frequency divider and the frequency divided output of said second frequency divider;

a filter for filtering the output of said comparator; and a voltage controlled oscillator controlled by the output of said filter for supplying said second frequency divider with a signal having a controlled frequency, wherein said first reference clock, has a 13.5 MHz High Vision signal system frequency, and said second reference clock, has a 54/1.001 MHz signal frequency which is related to said first reference clock frequency by a predetermined ratio 4×1000/1001, wherein, said fixed predetermined frequency division ratios of said first and second frequency dividers are adapted to perform frequency division assigned to the respective PLL circuit stage, and wherein, in the last PLL circuit stage other than the first stage, said fixed predetermined frequency division ratios of said first and second frequency dividers of said two PLL circuit stages are set such that the S/N ratio of said PLL circuit stage is smaller than the S/N ratio of the noise floor associated with said clock generation device.

* * * * *